(12) United States Patent
Hoelscher (10) Patent No.: US 10,823,811 B2
(45) Date of Patent: Nov. 3, 2020

(54) METHOD AND MAGNETIC RESONANCE APPARATUS FOR CALIBRATING A CONTROL SEQUENCE FOR EXAMINATION OF AN OBJECT

(71) Applicant: Siemens Healthcare GmbH, Erlangen (DE)

(72) Inventor: Uvo Hoelscher, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 114 days.

(21) Appl. No.: 16/123,180

(22) Filed: Sep. 6, 2018

(65) Prior Publication Data
US 2019/0072631 A1 Mar. 7, 2019

(30) Foreign Application Priority Data
Sep. 6, 2017 (EP) .................................... 17189538

(51) Int. Cl.
G01R 33/58 (2006.01)
G01R 33/54 (2006.01)
G01R 33/56 (2006.01)
G01R 33/48 (2006.01)

(52) U.S. Cl.
CPC ......... *G01R 33/586* (2013.01); *G01R 33/543* (2013.01); *G01R 33/583* (2013.01); *G01R 33/4828* (2013.01); *G01R 33/5607* (2013.01)

(58) Field of Classification Search
CPC .. G01R 33/543; G01R 33/583; G01R 33/586; G01R 33/4828; G01R 33/5607

USPC .................................................. 324/300–322
See application file for complete search history.

(56) References Cited

U.S. PATENT DOCUMENTS

| | | | | |
|---|---|---|---|---|
| 6,091,242 A | * | 7/2000 | Hanawa | G01R 33/4833 324/300 |
| 7,199,583 B2 | * | 4/2007 | Ikezaki | G01R 33/4828 324/309 |
| 9,449,386 B2 | * | 9/2016 | Ma | G06K 9/46 |
| 9,575,154 B2 | * | 2/2017 | Simonetti | G01R 33/4828 |
| 9,881,394 B2 | * | 1/2018 | Ma | G01R 33/4828 |
| 10,209,336 B2 | * | 2/2019 | Bhat | G01R 33/56509 |
| 10,295,624 B2 | * | 5/2019 | Adalsteinsson | G01R 33/365 |
| 10,534,048 B2 | * | 1/2020 | Arai | G01R 33/288 |
| 2006/0058634 A1 | * | 3/2006 | Ikezaki | G01R 33/4828 600/410 |

(Continued)

*Primary Examiner* — Patrick Assouad
*Assistant Examiner* — Sean Curtis
(74) *Attorney, Agent, or Firm* — Schiff Hardin LLP (57) ABSTRACT

In a method and magnetic resonance for calibrating a control sequence for the apparatus, having a first radio-frequency pulse and a second radio-frequency pulse, for a magnetic resonance examination of an examination region of an object, a first reference value for the first radio-frequency pulse for resonant excitation of a first substance is determined, and a second reference value for the second radio-frequency pulse for resonant excitation of a second substance is determined. The determination of the first reference value includes a selective excitation of the first substance and/or the determination of the second reference value includes a selective excitation of the second substance. The MR control sequence is calibrated by assignment, in a processor, of the first reference value to the first radio-frequency pulse and assignment of the second reference value to the second radio-frequency pulse.

22 Claims, 3 Drawing Sheets

(56) References Cited

U.S. PATENT DOCUMENTS

| | | | |
|---|---|---|---|
| 2007/0145975 A1* | 6/2007 | Feiweier | G01R 33/583 |
| | | | 324/307 |
| 2009/0112081 A1* | 4/2009 | Yu | G01R 33/4828 |
| | | | 600/410 |
| 2012/0119740 A1* | 5/2012 | Takahashi | G01R 33/48 |
| | | | 324/309 |
| 2013/0249552 A1* | 9/2013 | Imamura | G01R 33/583 |
| | | | 324/309 |
| 2013/0249553 A1* | 9/2013 | Simonetti | G01R 33/583 |
| | | | 324/309 |
| 2013/0249554 A1* | 9/2013 | Simonetti | G01R 33/583 |
| | | | 324/309 |
| 2016/0054408 A1* | 2/2016 | Horger | G01R 33/3875 |
| | | | 324/309 |
| 2016/0209484 A1* | 7/2016 | Bauer | G01R 33/583 |
| 2017/0319097 A1* | 11/2017 | Amthor | A61B 5/4872 |
| 2018/0210056 A1* | 7/2018 | Koehler | G01R 33/56527 |
| 2018/0364317 A1* | 12/2018 | Shen | G01R 33/543 |
| 2019/0025386 A1* | 1/2019 | Feiweier | A61B 5/055 |
| 2019/0072631 A1* | 3/2019 | Hoelscher | G01R 33/583 |

* cited by examiner

METHOD AND MAGNETIC RESONANCE APPARATUS FOR CALIBRATING A CONTROL SEQUENCE FOR EXAMINATION OF AN OBJECT

BACKGROUND OF THE INVENTION

Field of the Invention

The invention concerns a method for calibrating a magnetic resonance (MR) control sequence, as well as an MR apparatus and a non-transitory, computer-readable data storage medium that implement such a method.

Description of the Prior Art

In the scanner of a magnetic resonance apparatus the body of an examination object, in particular a patient, is exposed by the operation of a basic filed magnet to a relatively high basic magnetic field, for example of 1.5 or 3 or 7 tesla. In addition gradient pulses are applied by operation of a gradient coil arrangement. The gradient pulses spatially encode the magnetic resonance signals that are produced by a radio-frequency antenna radiating radio-frequency pulses, for example excitation pulses, so as to cause the resonantly exited nuclear spins of specific atoms to be flipped by a defined flip angle in relation to the magnetic field lines of the basic magnetic field. During the relaxation of the nuclear spins, radio-frequency signals, the aforementioned magnetic resonance signals (MR signals), are emitted, which are received by suitable radio-frequency antennas and then further processed. The desired image data can be reconstructed from the raw data acquired in this way, i.e. the MR signals. For a specific measurement, a specific magnetic resonance control sequence (MR control sequence), also called a pulse sequence is activated, which includes radiation of a sequence of radio-frequency pulses, for example excitation pulses and refocusing pulses, is to be, as well as gradient pulses suitably coordinated thereto on different gradient axes in different spatial directions. Readout windows suitably matching those pulses are activated, which predetermine periods in which the induced MR signals will be acquired. Such an MR control sequence is applied within the framework of a magnetic resonance examination, i.e. the radio-frequency pulses and gradient pulses are emitted in a defined time sequence and MR signals are detected.

The intensity of MR signals is dependent on the environment of the nuclear spins, in particular of the molecules in which the nuclear spins occur. This gives rise to a contrast in the reconstructed image data. For example, fat has a different signal intensity compared to water, which predominates in muscle tissue, for example. Suppression of the fat signal, also called fat saturation, is a usual technique in magnetic resonance imaging. In such cases the fat saturation can occur spectrally, wherein the chemical shift between nuclear spins in fat and nuclear spins in water is exploited: Nuclear spins in fat and nuclear spins in water have a different resonant frequency, i.e. Larmor frequency, in relation to the strength of the basic magnetic field. First, a saturation radio-frequency pulse with a low frequency bandwidth is radiated for resonant excitation of the nuclear spins in fat. These nuclear spins in fat dephase before radio-frequency pulses and gradient pulses to create the MR signals are applied. The saturation radio-frequency pulses have a frequency band such that nuclear spins in water will not be excited. Only nuclear spins that lie outside the frequency band of the saturation radio-frequency pulses contribute to the MR signals for the imaging. As an alternative, fat saturation can be implemented by inversion. In this case, first a radio-frequency pulse for inversion is radiated and the radio-frequency pulses and gradient pulses for creation of the MR signals follow after a defined inversion time, with the inversion time specifying the period of time between the radio-frequency pulse for inversion and the radio-frequency pulses and gradient pulses for creation of the MR signals. The radio-frequency pulse for inversion can be chemically selective. The inversion time is typically chosen such that the magnetization of the nuclear spins in fat at the time of imaging is located at the zero crossing and therefore does not contribute to the MR signal.

An adaptation of the radio-frequency pulses of an MR control sequence to the examination object and the examination region is required with respect to its frequency and amplitude. This has conventionally been done on the basis of a calibration for determining a reference voltage and a reference frequency. In this conventional procedure, initially a frequency spectrum of the Larmor frequencies of the nuclear spins that are present in the examination region is measured. The frequency spectrum typically has a dominant peak, which results from the nuclear spins surrounded by water. Its assigned frequency is typically used for the radio-frequency pulses for creation of the MR signals, i.e. as the reference frequency. From this reference frequency and the chemical shift, a reference frequency is calculated for the spectral fat saturation for the saturation radio-frequency pulse. The reference voltage specifies the electrical voltage, which is required for activation of the radio-frequency antenna by the radio-frequency antenna controller so as to produce a defined flip angle for a particular nuclear spin. The reference voltage is typically adjusted in accordance with the determination of the dependency of the flip angle of the nuclear spin created by a radio-frequency pulse on the voltage with which the radio-frequency antenna is activated by the radio-frequency antenna controller. Conventionally in such cases, the average flip angle within a defined volume that includes the entire examination region is considered.

SUMMARY OF THE INVENTION

An object of the invention is to provide a precise method for calibrating an MR control sequence.

The inventive method is for calibrating an MR control sequence that includes a first radio-frequency pulse and a second radio-frequency pulse for a magnetic resonance examination of an examination region of an examination object, by execution of the MR control sequence by the MR scanner.

In the inventive method, a first reference value for the first radio-frequency pulse for resonant excitation of a first substance is determined in a control computer of the MR scanner, and a second reference value for the second radio-frequency pulse for resonant excitation of a second substance is also determined in the computer. The determination of the first reference value includes a selective excitation of the first substance and/or the determination of the second reference value includes a selective excitation of the second substance. Calibration of the MR control sequence is implemented in the computer by assignment of the first reference value to the first radio-frequency pulse and assignment of the second reference value to the second radio-frequency pulse. The calibrating control sequence is then provided in the form of control signals to the MR scanner so as to operate the MR scanner according to the calibrated MR control sequence.

An MR control sequence includes radio-frequency pulses that modulate nuclear spins in different ways and thereby create MR signals with specific characteristics. Thus, for example, there are the following pulse types for radio-frequency pulses: Excitation pulses, refocusing pulses, preparation pulses. This list of pulse types is not definitive and further pulse types are conceivable. An excitation pulse flips nuclear spins by a defined flip angle in relation to the magnetic field lines of the basic magnetic field. A refocusing pulse, for example, can rotate a portion of the nuclear spins at right angles to the magnetic field lines of the basic magnetic field by 180°. A preparation pulse before an excitation pulse can cause a modulation, if necessary a selective modulation, of specific nuclear spins. The first radio-frequency pulse and the second radio-frequency pulse typically differ from one another. The first radio-frequency pulse and the second radio-frequency pulse can belong to different pulse types. The first radio-frequency pulse and the second radio-frequency pulse can be provided for partial areas of the examination region, which are different from one another. The first radio-frequency pulse and the second radio-frequency pulse are independent of one another. The first radio-frequency pulse and the second radio-frequency pulse preferably belong to different modules of the MR control sequence.

Radio-frequency pulses have a frequency bandwidth around a basic frequency and will accordingly be emitted in a frequency band defined by the basic frequency and the frequency bandwidth. The basic frequency corresponds to the frequency of the radio-frequency pulse, i.e. the carrier frequency. A radio-frequency pulse brings about a resonant excitation of a substance, provided the Larmor frequency of a nuclear spin in the substance corresponds to the frequency of the radio-frequency pulse, in particular at the position of the nuclear spin. A radio-frequency pulse can bring about an excitation of a substance, provided the Larmor frequency of a nuclear spin comprised by the substance is encompassed by the frequency band of the radio-frequency pulse.

A substance can be a molecule, a combination of different molecules, and/or a tissue. A substance can also be a further structure, which will not be specified explicitly here, and is not restricted to the examples given. The first substance and the second substance are typically different from one another.

The selective excitation of the second substance typically means the resonant excitation of the second substance. The first substance is preferably excluded from the resonant excitation. Preferably further substances different from the second substance, especially preferably all substances different from the second substance, are excluded from the resonant excitation. The first substance is preferably not excited during the selective excitation of the second substance, i.e. not resonantly excited. The selective excitation of the first substance means the resonant excitation of the first substance. The second substance is preferably excluded from the resonant excitation. Preferably further substances different from the first substance, especially preferably all substances different from the first substance, are excluded from the resonant excitation. The second substance is preferably not excited during the selective excitation of the first substance, i.e., not resonantly excited. Preferably the selective excitation is done chemically selectively, i.e. spectrally selectively, by the basic frequency and/or the bandwidth of the radio-frequency pulses being selected accordingly. The selective excitation can also be done by inversion. A binomial pulse can be used for selective excitation. The determination of a reference value by a selective excitation can also include a measurement having a number of radio-frequency pulses for selective excitation, wherein radio-frequency pulses preferably have the same selective characteristic.

Image data are to be created from a partial area of the examination object, the examination region, within the framework of the magnetic resonance examination. The examination object is typically a patient. The examination region typically is a section of the examination object.

A reference value has at least one parameter that can be taken into account in the application of a radio-frequency pulse. A radio-frequency pulse is defined by a number of parameters. A large part of this number of parameters for a radio-frequency pulse is typically given by the MR control sequence. This can be the duration and/or the form of the envelope of the radio-frequency pulse. A magnetic resonance examination typically requires an adaptation of at least one parameter to the examination object and/or to the examination region, which is to be determined within the framework of a calibration. A reference value is a parameter for a radio-frequency pulse, which is dependent on the examination object and/or on the examination region. A reference value typically is a parameter for the radio-frequency pulse, which is stored in the MR control sequence as a variable.

An assignment of a reference value to a radio-frequency pulse brings about a linkage of the reference value to the radio-frequency pulse. In the application of the MR control sequence including the radio-frequency pulse, the reference value is typically taken into account as at least one parameter for the radio-frequency pulse.

In the inventive method, reference values independent of one another are determined for at least two substances that differ from one another and/or for at least two radio-frequency pulses that differ from one another. It has been recognized within the framework of this invention that the conventional method for calibration of the variety of substances, such as fat and water, can be taken into account only by a fixed value for the chemical shift. In particular, the selective excitation of the first substance and/or of the second substance makes possible a more precise determination of at least one characteristic of the first substance and/or of the second substance. This characteristic can be the Larmor frequency of the nuclear spins of the first substance and/or second substance for example. The characteristic can be, for example, the dependency of the flip angle of the nuclear spins of the first substance and/or second substance created by a radio-frequency pulse on the electrical voltage, with which the radio-frequency antenna is activated by the radio-frequency antenna controller. This enables the reference values to be determined especially precisely and the calibration of the MR control sequence can be carried out especially exactly. The influence of an uneven distribution of the first substance and of the second substance can be established and/or compensated for.

The inventive method accordingly allows the use of different reference values for different substances. The selective excitation of at least one substance makes possible a determination of a reference value, which is at least partly independent of a reference value valid for the entire examination region. This is in particular advantageous for preparation pulses that modulate the magnetization of spins of a specific substance, typically different from water. If the second radio-frequency pulse is a preparation pulse, then the second reference value is preferably determined by selective excitation of the second substance. This enables the spatial distribution, the Larmor frequency and/or the actual dependency of the flip angle of the nuclear spins of the second substance induced as a result of an electrical voltage, with which the radio-frequency antenna is activated by the radio-frequency antenna controller to be taken into account in the determination of the second reference value, for example.

The calibrated MR control sequence is preferably provided to the controller of the magnetic resonance scanner. The magnetic resonance scanner is designed to execute the calibrated MR control sequence by receiving control signals from the controller that are produced so as to correspond to the calibrated MR control sequence. The optional application of the calibrated MR control sequence causes the recording of MR signals of the examination region of the examination object, which can be reconstructed into image data. The image data, due to being based on the inventively calibrated MR control sequence, have a higher quality and/or homogeneity than image data based on an MR control sequence with a conventional calibration.

In an embodiment of the method, in a further method step, a frequency spectrum of substances in the examination region is determined, and the frequency spectrum is taken into account in the determination of the first reference value and/or of the second reference value. Also, within the framework of this method step, there is preferably a conventional calibration of the reference voltage over at least the examination region.

In this method step, the frequency spectrum of the Larmor frequencies of the nuclear spins in the examination region is measured. The frequency spectrum specifies the signal intensity in the examination region depending on the frequency. Since the Larmor frequency of nuclear spins depends on the substance surrounding those nuclear spins, a spectral distribution of the signal intensity is present. The Larmor frequency is produced by the gyromagnetic ratio of the nuclear spin in question and the strength of the magnetic field surrounding that nuclear spin. The magnetic field surrounding the nuclear spin is predominantly the result of the basic magnetic field, which is modulated, however, by the chemical environment of the nuclear spin, in particular the substance surrounding the nuclear spin. The modulation is quantified on the basis of the chemical shift, which amounts to around 3.4 ppm between fat and water for example.

In accordance with this embodiment, the method step for determination of a frequency spectrum is preferably the starting point for at least one further measurement, in particular for the selective excitation of the first and/or the second substance. Based on the frequency spectrum, an approximate value for the Larmor frequency of the first substance and/or second substance can be established. In this case, the Larmor frequencies of the two substances can be established based on an analysis of the curve of the frequency spectrum, without taking into account a known chemical shift between the first substance and the second substance. Instead, on the basis of a known chemical shift between the first substance and the second substance, the result for the Larmor frequencies of the two substances can be checked based on an analysis of the curve of the frequency spectrum.

The approximate value for the Larmor frequency of the first substance and/or second substance can be used in the selective excitation of the second substance as the basic frequency of an excitation pulse, wherein by the selective excitation of the first substance and/or second substance, further characteristics of the first substance and/or second substance can be established. For example, by the selective excitation of the first substance and/or second substance, a frequency spectrum exclusively of the first substance and/or exclusively of the second substance can be obtained. This enables the Larmor frequency of the first substance and/or second substance to be determined especially precisely. Moreover, based on a selective excitation of the first substance and/or second substance, there can be a calibration of the reference voltage for the first substance and/or second substance. This enables the first reference value for the first substance and the second reference value for the second substance to be determined especially precisely. This embodiment accordingly makes it possible to determine the first reference value and the second reference value especially efficiently and precisely. This results in an especially compact calibration of the MR control sequence.

In another embodiment of the method in an additional method step, there is a determination of a general reference value for radio-frequency pulses for the examination region comprised by the MR control sequence, wherein the general reference value is taken into account in the determination of the first reference value and/or of the second reference value.

The general reference value is valid or uniform for the entire examination region. The general reference value preferably is a reference voltage, which has been established by conventional calibration in the additional method step. In accordance with this embodiment, the general reference value is an approximate value for the entire examination region, which can be adapted in the further course of the method with respect to the first substance and/or the second substance and/or the first radio-frequency pulse and/or of the second radio-frequency pulse.

An advantage of this embodiment is that the general reference value specifies an approximation for the first reference value and/or the second reference value, which in this embodiment can be adapted in detail to individual substances and/or the radio-frequency pulses. This enables the calibration to be undertaken especially efficiently.

In another embodiment of the method, a spatial distribution of the first substance and/or of the second substance is taken into account during the determination of the first reference value and/or of the second reference value.

A spatial distribution of a substance provides the spatially resolved positions of the examination region, at which positions the substance is present. The spatial distribution of a substance can be determined, for example, by a segmentation of the substance in image data that already exists, and/or on the basis of a selection made by a user.

The spatial distribution of a substance can also be determined within the framework of the determination of a measured value, such as by a measurement that includes a selective excitation of the substance in the recording of MR signals with the MR signals being reconstructed into image data, wherein the radio-frequency pulses used in this case selectively excite the substance. The image data resulting therefrom visualize only the substance that has been selectively excited. The image data resulting therefrom have a lower resolution than the diagnostic image data, which will be created with the calibrated MR control sequence. The image data resulting from the selective excitation can reflect the spatial distribution of the substance.

The basic magnetic field, also referred to as the B0 field, and the B1 field created by a radio-frequency pulse, are typically not perfectly homogeneous within the examination region. When the spatial distribution of such fields is considered, this is typically not uniform throughout the examination region. The spatial distribution of the B0 field or of the B1 field is typically determined of a calibration of an MR control sequence. Based on the average B1 field, the reference voltage for all radio-frequency pulses in the MR control sequence is typically determined.

This embodiment of the inventive method allows a determination of a reference value for a substance depending on its spatial distribution. In particular, during the determination of a reference value, a spatial distribution of the B0 field and/or B1 field for a substance, in addition to its spatial distribution, can be taken into account. For example, in the determination of a reference voltage as reference value, the spatial distribution of the overall B1 field can be taken into account and the reference voltage can be calculated based on a portion of the B1 field, with this portion overlapping with the spatial distribution of the substance. Likewise, in the determination of a basic frequency as the reference value, the spatial distribution of the B0 field can be taken into account in addition to the Larmor frequency of the substance.

This embodiment makes possible an especially precise determination of reference values for different substances. This form of embodiment makes it possible to take account of further parameters, which depend on the examination object and/or on the examination region and/or on the magnetic resonance device. B1 fields are inhomogeneous, for example, when they irradiate spherical shapes and/or ellipses, such as the head and/or trunk of a patient, since such shapes intensify B1 fields in the center of the shape and attenuate them at the edge. Because fat occurs frequently at the edge of a body shape, taking account of the spatial distribution of the B1 field is especially advantageous when acquiring MR signals from nuclear spins in fat tissue.

In another of embodiment of the method, the first radio-frequency pulse is used for creation of an MR signal and the second radio-frequency pulse is used for modulation of the contrast of that MR signal.

The first radio-frequency pulse, in this embodiment, is a radio-frequency pulse required for the creation of the MR signal. If the MR control sequence is a spin echo sequence for example, then the first radio-frequency pulse can be an excitation pulse and/or a refocusing pulse. The first radio-frequency pulse is designed so that if the first radio-frequency pulse were not radiated, no MR signal would be created. A number of radio-frequency pulses are typically required for the creation of an MR signal. This number is assigned during the calibration of the MR control sequence to the first reference value. The part of an MR control sequence that results in the creation of the MR signal can be referred to as the core of the MR control sequence.

In accordance with this embodiment the second radio-frequency pulse is a radio-frequency pulse that is dispensable (optional) for the creation of an MR signal. The second radio-frequency pulse is preferably a preparation pulse. Further radio-frequency pulses can be required for the modulation of the contrast, which are preferably assigned to the second reference value during the calibration of the MR control sequence. The MR control sequence is preferably constructed such that the modulation of the contrast is done before the creation of the MR signal and/or the second radio-frequency pulse is applied before the first radio-frequency pulse. A different order is also conceivable.

This embodiment of the inventive method thus makes possible a calibration of radio-frequency pulses for modulation of the contrast independent of the core of an MR control sequence. These radio-frequency pulses for modulation of the contrast are typically preparation pulses, in particular saturation pulses, which involve the second substance. The separate calibration enables the preparation pulses to be adapted especially well to the second substance, so that the resulting contrast of the image data is especially clear. This enables the quality of the calibration and of the image data to be enhanced.

In another embodiment of the method, the first substance is water and/or the second substance is fat. A substance is considered as water if the majority of the nuclear spins thereof, in particular those contributing to the MR signal, are typically integrated into water molecules. The first substance can be various types of tissue, such as blood, tendons, muscles, gray matter and/or white matter. The second substance can be different types of fat. The second substance can also be different types of tissue.

When the first substance is water, the inventive method makes possible an exact calibration for different tissue, which produces a high image quality. When the second substance comprises fat, then a fat saturation can be carried out especially homogeneously. This is especially advantageous, since numerous MR control sequences are carried out with and without fat saturation. The inventive method makes a complete fat saturation possible as a result of the precise calibration.

In another embodiment of the method, the first reference value and/or the second reference value to comprise a basic frequency. This embodiment makes possible an especially precise determination of the basic frequency, i.e. the frequency at which a radio-frequency pulse is emitted. This enables a resonant excitation of the first substance and/or of the second substance to be insured especially well.

In another embodiment of the method, the first reference value and/or the second reference value t is a reference voltage. The first reference voltage is typically defined such that the first substance is flipped on average by the flip angle defined by the radio-frequency pulse. The second reference voltage is typically defined such that the second substance is flipped on average by the flip angle defined by the radio-frequency pulse. In accordance with this form of embodiment inhomogeneities of the B1 field can be taken into account. This is in particular advantageous for examination objects and/or examination regions, which, because of dielectric characteristics, bring about a spatial modulation of the B1 field. This is likewise advantageous for locally occurring substances within the examination region. It is moreover especially advantageous if at positions of the locally occurring substances the B1 field deviates from its average value in the examination region. This form of embodiment thus makes a flexible calibration of the MR control sequence possible.

The invention also encompasses a magnetic resonance (MR) apparatus having an MR scanner operated by a calibration processor. The calibration processor is designed to carry out the inventive method for calibrating an MR control sequence.

The calibration processor has an input, a processing circuitry, and an output. Via the input the calibration processor is provided with an original MR control sequence and/or information with respect to a radio-frequency pulse of the MR control sequence and/or information with respect to the first substance and/or the second substance and/or the examination region. Likewise via the input, the calibration processor can be provided with a B0 map and/or a B1 map. Further functions, algorithms or parameters needed in the method can be provided to the calibration processor via the input. The first reference value and/or the second reference value and/or the adjusted MR control sequence and/or further results of embodiments of the inventive method can be provided via the output. The calibration processor can be integrated into the magnetic resonance apparatus or can also be installed separately from the magnetic resonance apparatus. The calibration processor can be connected to the magnetic resonance apparatus.

Embodiments of the inventive magnetic resonance apparatus are analogous to the embodiments of the inventive method described above. The magnetic resonance apparatus can have further control components, which are necessary and/or advantageous for carrying out the inventive method. The magnetic resonance device can also be designed to send control signals and/or to receive control signals and/or to process such signals in order to carry out the inventive method. Preferably the calibration processor is part of the control computer of the inventive magnetic resonance apparatus. Computer programs and further software can be stored on a memory of the calibration processor, by which the processing circuitry of the calibration processor automatically controls and/or carries out an execution sequence of the inventive method.

The present invention also encompasses a non-transitory, computer-readable data storage medium encoded with programming instructions (program code) that, when the storage medium is loaded into a computer or computer system of a magnetic resonance apparatus, cause the computer or computer system to operate the magnetic resonance apparatus so as to execute any or all embodiments of the method according to the invention, as described above.

Examples for electronically-readable data media are a DVD, a magnetic tape or a USB stick, on which electronically-readable control information, in particular software, is stored.

The advantages and embodiments of the inventive magnetic resonance apparatus and of the inventive electronically-readable data medium essentially correspond to the advantages and embodiments of the inventive method for calibrating an MR control sequence, which have described above in detail.

DESCRIPTION OF THE PREFERRED EMBODIMENTS

Figure 1:
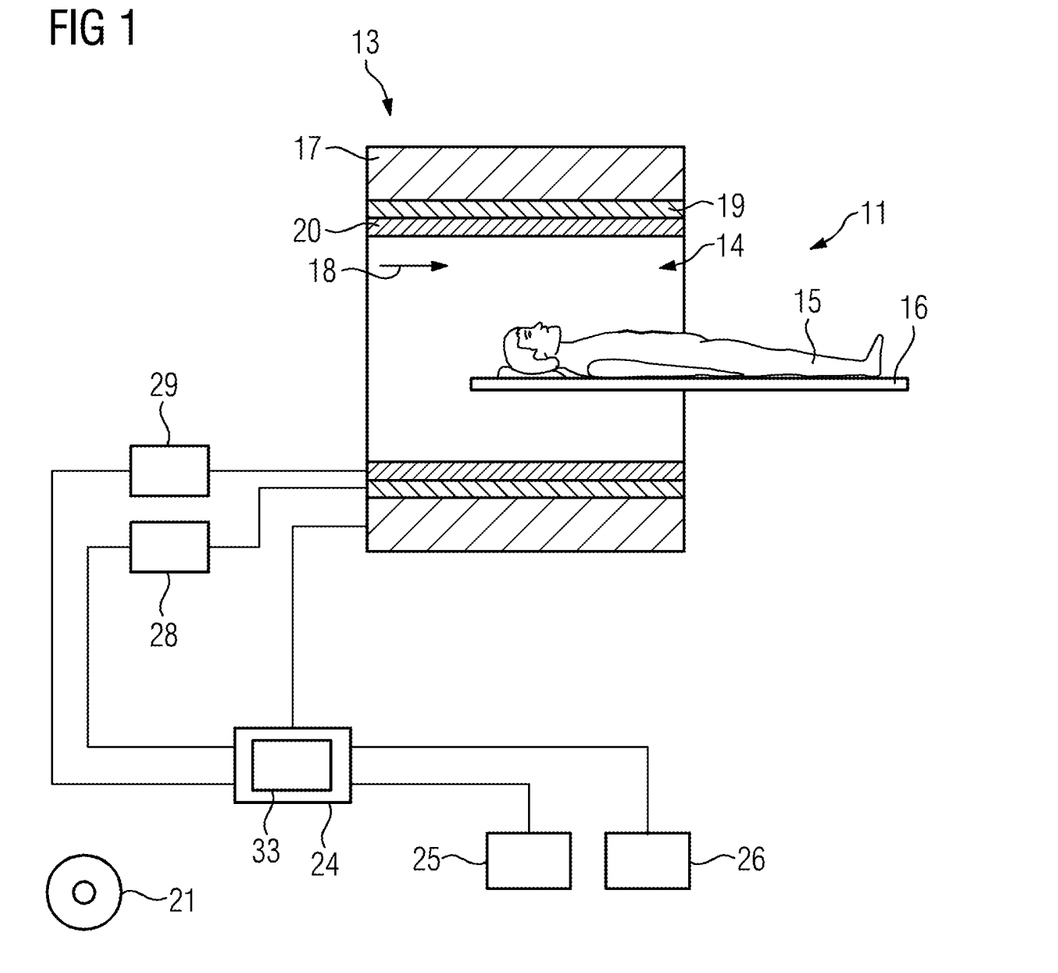
FIG. 1 schematically illustrates an inventive magnetic resonance apparatus.

FIG. 1 shows a magnetic resonance apparatus 11 for carrying out an inventive method, in a schematic diagram. The magnetic resonance apparatus 11 has a scanner 13 with a basic field magnet 17 that produces a strong and constant basic magnetic field 18. The magnetic resonance scanner 13 has a cylindrical patient receiving area 14 that receives an examination object 15, for example a patient. The patient receiving area 14 is circumferentially surrounded direction by the scanner 13. The examination object 15 can be moved by a patient support 16 into the patient receiving area 14.

The scanner 13 furthermore has a gradient coil arrangement 19 that is operable so as to spatially encode the MR signals. The gradient coil arrangement 19 is controlled by a gradient controller 28. The scanner 13 also has a radio-frequency (RF) antenna 20, which, in the case shown, is formed as a body coil integrated permanently into the scanner 13. The radio-frequency antenna 20 is controlled by a radio-frequency antenna controller 29 so as to radiate radio-frequency pulses into an examination volume, is essentially formed by the patient receiving area 14. The radio-frequency pulses give certain nuclear spins in the examination object 15 a magnetization that causes those nuclear spins to deviate from the field lines of the basic magnetic field 18, by an amount known as a flip angle. As these excited nuclear spins relax, and return to the steady state, they emit the aforementioned MR signals, which are received by the same antenna 20 that radiated the radio-frequency pulses, or by a different antenna. The received MR signals are reconstructed into image data in a known manner, and the image data are displayed as an MR image of the examination object 15.

For control of the basic field magnet 17, the gradient controller 28 and the radio-frequency antenna controller 29, the magnetic resonance apparatus 11 has a control computer 24. The control computer 24 centrally controls the magnetic resonance apparatus 11, so as to execute MR control sequences. The control computer 24 includes a reconstruction processor (not shown), for reconstruction of medical image data from the MR signals (raw data) acquired during the magnetic resonance examination. The magnetic resonance apparatus 11 has a display monitor 25. Control information such as control parameters, as well as reconstructed image data, can be displayed on the display monitor 25 for a user. The magnetic resonance apparatus 11 has an input unit 26, via which information and/or control parameters can be entered by a user during a measurement process. The control computer 24 can include the gradient controller 28 and/or radio-frequency antenna controller 29 and/or the display monitor 25 and/or the input unit 26.

The control computer 24 furthermore includes a calibration processor 33. The calibration processor 33 is designed to implement the inventive method for calibrating an MR control sequence. For this purpose, the calibration processor 33 has computer programs and/or software, which are able to be loaded directly into a memory (not shown) of the calibration processor 33, with program code that causes the inventive method for calibrating an MR control sequence to be executed when the computer program or software runs in the calibration processor 33. For this purpose, the calibration processor 33 has processing circuitry designed to run the computer programs and/or software. The computer programs and/or software can be stored on a non-transitory, electronically-readable data storage medium 21 that can be loaded into the calibration processor 33.

The magnetic resonance apparatus 11 shown can naturally have further components that magnetic resonance apparatuses usually have. The general manner in which a magnetic resonance apparatus functions is known to those skilled in the art, so that a more detailed description is not necessary herein. The magnetic resonance apparatus 11 is thus designed, together with the calibration processor 33, for carrying out the inventive method.

As noted, the method for calibrating an MR control sequence is available in the form of a program code stored on the non-transitory electronically-readable data storage medium 21. When the data storage medium 21 is loaded in the calibration processor 33 and the program code is run, the inventive method is executed.

Figure 2:
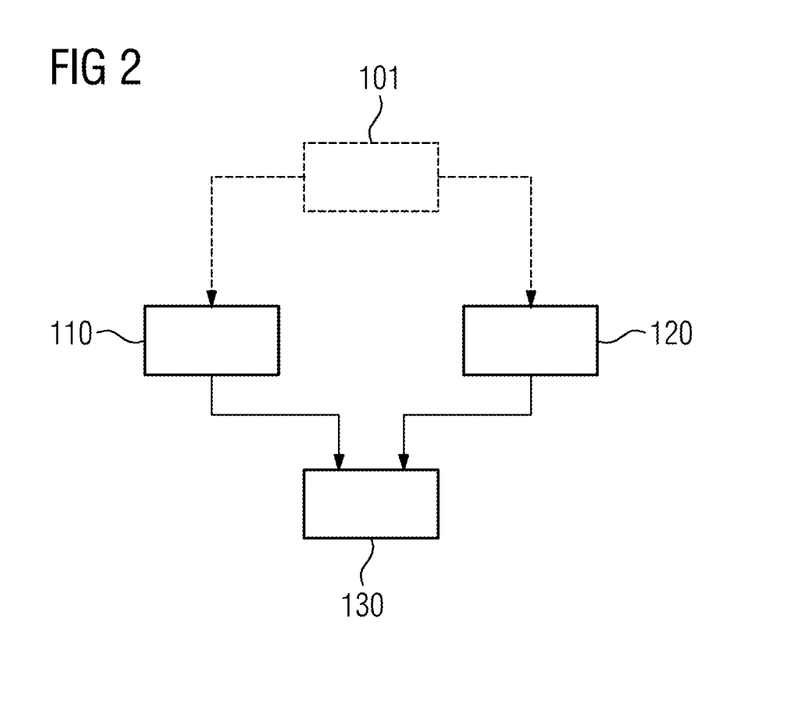
FIG. 2 is a flowchart of a first embodiment of the inventive method.

FIG. 2 is a flowchart of a first embodiment of an inventive method. At the beginning of the inventive method an MR control sequence is present in an original version. For a magnetic resonance examination of an examination region of an examination object 15, an application of an MR control sequence adapted for the examination region of the examination object 15 is required, with the adaptation requiring a calibration of the original MR control sequence. The MR control sequence includes at least a first radio-frequency pulse and a second radio-frequency pulse and at least a first substance and a second substance are present in the examination region 15. The calibration is undertaken in accordance with the method steps 110, 120, 130. In method step 110, there is the determination of a first reference value for the first radio-frequency pulse for resonant excitation of a first substance. In method step 120 a second reference value is determined for the second radio-frequency pulse for resonant excitation of a second substance. The method steps 110 and 120 can be carried out at least in part simultaneously, or consecutively. The determination of the first reference value in method step 110 can include a selective excitation of the first substance. The determination of the second reference value in method step 120 can comprise a selective excitation of the second substance. In method step 130 the MR control sequence is calibrated by assignment of the first reference value to the first radio-frequency pulse and by assignment of the second reference value to the second radio-frequency pulse.

Finally, control signals corresponding to the calibrated MR control sequence are provided from the calibration processor 33, via the control computer 24, to the magnetic resonance scanner 13 so as to be executed in the examination region, wherein the first radio-frequency pulse is parameterized with the first reference value and the second radio-frequency pulse is parameterized with the second reference value.

Before the beginning of the method, in an optional method step 101, there can be the determination of a general reference value for radio-frequency pulses of the MR control sequence for the examination region. The general reference value can then be taken into account in method step 110 and/or in method step 120.

Figure 3:
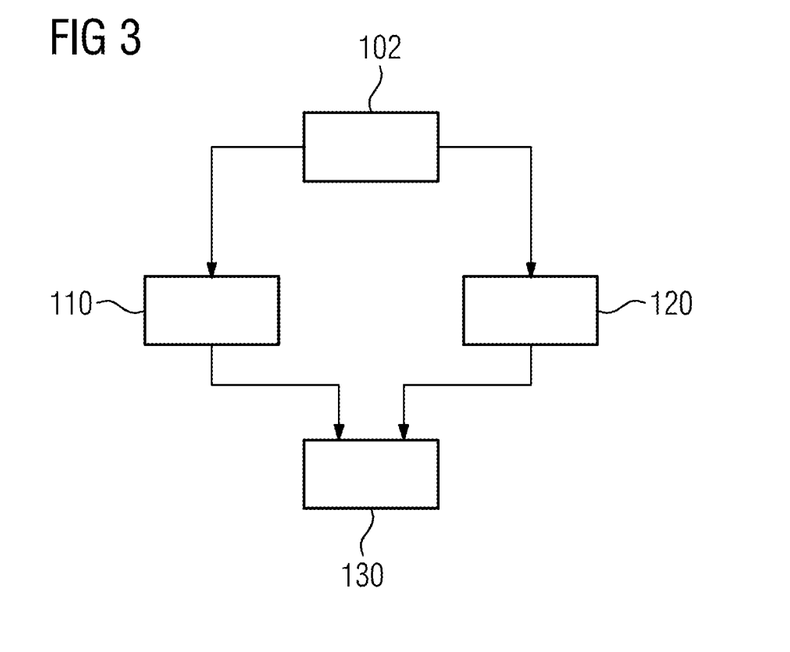
FIG. 3 is a flowchart of a second embodiment of the inventive method.

FIG. 3 shows a flowchart of a second embodiment of an inventive method. This second embodiment differs from the first form of embodiment shown in FIG. 2 in that the method begins with method step 102, the determination of a frequency spectrum of substances comprised by the examination region. The frequency spectrum is taken into account in the determination of the first reference value in method step 110 and/or the determination of the second reference value in method step 120. Taking account of the frequency spectrum in method step 110 and/or method step 120 is preferably done such that there is a frequency-selective measurement based on the frequency spectrum.

Figure 4:
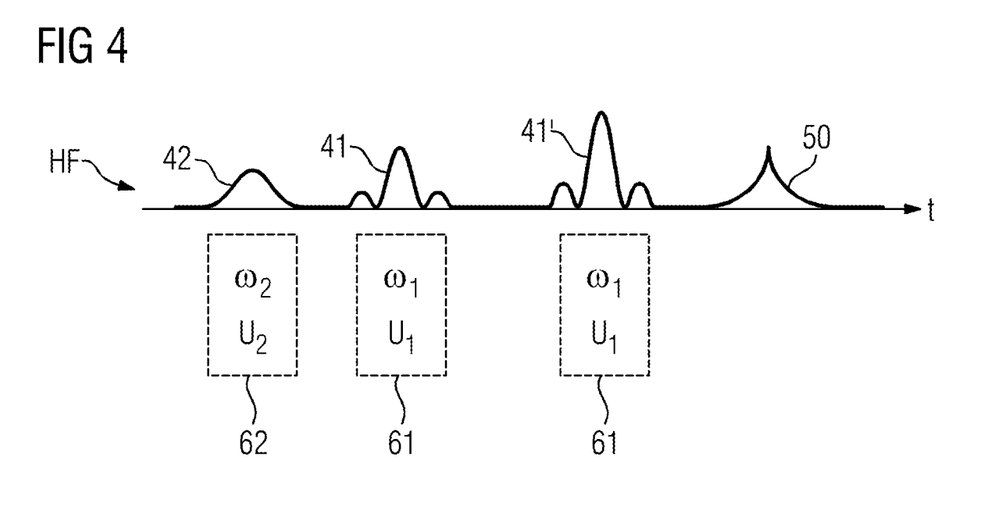
FIG. 4 is a schematic diagram of a timing sequence of an adjusted MR control sequence.

FIG. 4 shows a schematic diagram of a timing sequence of a calibrated MR control sequence. At least a part of the timing sequence of the radio-frequency pulses 41, 41', 42 comprised by the MR control sequence and of the radio-frequency signals (MR signals) 50 induced thereby is shown schematically along the time line t. Specified below the radio-frequency pulses 41, 41', 42 of the MR control sequence are their reference voltages $U_1$, $U_2$ and reference frequencies $\omega_1$, $\omega_2$, and thus their reference values 61, 62. The reference voltages $U_1$, $U_2$ give a measure for scaling the amplitude of the corresponding radio-frequency pulses 41, 41', 42. The reference frequencies $\omega_1$, $\omega_2$ specify the basic frequency of the corresponding radio-frequency pulses 41, 41', 42. The MR control sequence comprises the first radio-frequency pulses 41, 41', which are designed for creation of an MR signal 50. The first radio-frequency pulses 41, 41' are embodied in the form shown for creating a spin echo. In this case the first radio-frequency pulse 41 typically induces a transversal magnetization of the nuclear spins of the first substance, in that said pulse brings about a rotation around the nuclear spins by 90° in relation to the magnetic field lines of the basic magnetic field. The first radio-frequency pulse 41' following thereafter creates a mirroring of the transversal magnetization on a transversal axis, in that the first radio-frequency pulse 41' brings about a rotation around the nuclear spins by 180°. Through this a spin echo is formed, which emits a radio-frequency signal, in particular an MR signal 50. The first radio-frequency pulses 41, 41' are thus embodied for creation of an MR signal 50.

The first radio-frequency pulses 41, 41' in this case have a first reference voltage $U_1$ and a first reference frequency $\omega_1$, which are comprised by the first reference value 61. The first reference value 61, which includes a first reference voltage $U_1$ and a first reference frequency $\omega_1$, is accordingly assigned to the first radio-frequency pulses 41, 41'.

The second radio-frequency pulse 42 is used in the MR control sequence shown for modulation of the contrast of the MR signal. For this purpose, the second radio-frequency pulse 42 in the MR control sequence shown can bring about a fat saturation for example, when the second substance 32 is fat. The second radio-frequency pulse 42 in this case is applied in accordance with the second reference value 62, which has a second reference voltage $U_2$ and a second reference frequency $\omega_2$. The second reference frequency $\omega_2$ is typically selected such that the difference between the second reference frequency $\omega_2$ and the first reference frequency $\omega_1$ corresponds to the chemical shift between the second substance 32 and the first substance 31. The second reference voltage $U_2$ is preferably determined taking into account the spatial distribution of the second substance 32 and/or a spatial distribution of an amplitude of a radio-frequency pulse created by the radio-frequency antenna 20. The first reference voltage $U_1$ is preferably determined taking into account the spatial distribution of the first substance 31 and/or a spatial distribution of an amplitude of a radio-frequency pulse created by the radio-frequency antenna 20.

Figure 5:
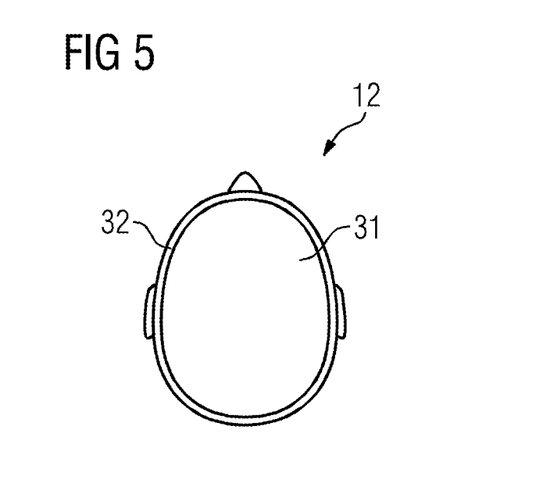
FIG. 5 shows an example for a spatial distribution of the first substance and of the second substance the head of a patient.

FIG. 5 shows an example of a spatial distribution of the first substance 31 and of the second substance 32 in the head of the patient. The examination region 12 preferably corresponds in this case to the entire head. The first substance 31 preferably is water. The second substance 32 preferably is fat. In the excitation of a substance nuclear spins with a defined gyromagnetic ratio, typically hydrogen protons, which are comprised by this substance, are preferably excited, in particular modulated. FIG. 5 visualizes a heavily localized arrangement of the first substance 31 and of the second substance 32. Since the propagation of radio-frequency waves is in particular influenced by spherical arrangements, such as for example by the head shown, the radio-frequency pulse can have a position-dependent amplitude. This leads in particular in the center of the head, i.e. in the area of the first substance 31, to a higher radio-frequency signal than at the edge of the head, i.e., in the area of the second substance 32. In the determination of the first reference value 61 and/or of the second reference value 62 a spatial distribution of the first substance 31 and/or of the second substance 32 can be taken into account.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for calibrating a magnetic resonance (MR) control sequence, comprising:
    providing a calibration processor with an MR control sequence comprising a first radio-frequency (RF) pulse and a second RF pulse for operating an MR data acquisition scanner in order to execute an MR scan of an examination region of an object;
    with said calibration processor
        determining a first reference value for the first RF pulse for resonant excitation of a first substance in said examination region;
        determining a second reference value for the second RF pulse for resonant excitation of a second substance in said examination region;
        determining at least one of said first reference value and said second reference value by operating said MR data acquisition scanner to execute a selective excitation of said first substance, or operating said MR data acquisition scanner with selective excitation of said second substance;
        calibrating said original MR control sequence in order to produce a calibrated MR control sequence by assigning said first reference value to said first RF pulse and assigning said second reference value to said second RF pulse;
        generating control signals corresponding to the calibrated MR control sequence, and emitting said control signals to said MR data acquisition scanner in order to operate the MR data acquisition scanner according to the calibrated MR control sequence in said MR scan of said object; and
        determining a spatial distribution of at least one of said first substance in said examination region and second substance in said examination region, and determining at least one of said first reference value and said second reference value dependent on said spatial distribution.

2. A method as claimed in claim 1, comprising:
    in said calibration processor, determining a frequency spectrum of substances in said examination region; and
    determining at least one of said first reference value and said second reference value dependent on said frequency spectrum.

3. A method as claimed in claim 1, comprising:
    in said calibration processor, determining a general reference value for the examination region, for all RF pulses in said original MR control sequence; and
    determining at least one of said first reference value and said second reference value dependent on said general reference value.

4. A method as claimed in claim 1, comprising:
    executing said MR scan with said calibrated MR sequence by using said first RF pulse for generating an MR signal, and using said second RF pulse for modulating a contrast of said MR signal.

5. A method as claimed in claim 1, wherein said first substance is water, and
    wherein said second substance is fat.

6. A method as claimed in claim 1, wherein at least one of said first reference value and said second reference value is a reference frequency.

7. A method as claimed in claim 1, wherein at least one of said first reference value and said second reference value is a reference voltage.

8. A magnetic resonance (MR) apparatus comprising:
    an MR data acquisition scanner; and
    a calibration processor provided with an MR control sequence comprising a first radio-frequency (RF) pulse and a second RF pulse for operating said MR data acquisition scanner in order to execute an MR scan of an examination region of an object,
    wherein said calibration processor is configured to:
        determine a first reference value for the first RF pulse for resonant excitation of a first substance in said examination region, and to determine a second reference value for the second RF pulse for resonant excitation of a second substance in said examination region;
        determine at least one of said first reference value and said second reference value by operating said MR data acquisition scanner to execute a selective excitation of said first substance, or operating said MR data acquisition scanner with selective excitation of said second substance;
        calibrate said original MR control sequence in order to produce a calibrated MR control sequence by assigning said first reference value to said first RF pulse, and assigning said second reference value to said second RF pulse; and
        generate control signals corresponding to the calibrated MR control sequence, and to emit said control signals to said MR data acquisition scanner in order to operate the MR data acquisition scanner according to the calibrated MR control sequence in said MR scan of said object,
    wherein at least one of said first reference value and said second reference value is a reference voltage.

9. A non-transitory, computer-readable data storage medium encoded with programming instructions, said storage medium being loaded into a computer of a magnetic resonance (MR) apparatus comprising an MR data acquisition scanner, said programming instructions causing said computer to:
    receive an MR control sequence comprising a first radio-frequency (RF) pulse and a second RF pulse for operating said MR data acquisition scanner in order to execute an MR scan of an examination region of an object;
    determine a first reference value for the first RF pulse for resonant excitation of a first substance in said examination region;
    determine a second reference value for the second RF pulse for resonant excitation of a second substance in said examination region;
    determine at least one of said first reference value and said second reference value by operating said MR data acquisition scanner to execute a selective excitation of said first substance, or operating said MR data acquisition scanner with selective excitation of said second substance;
    calibrate said original MR control sequence in order to produce a calibrated MR control sequence by assigning said first reference value to said first RF pulse and assigning said second reference value to said second RF pulse;
    generate control signals corresponding to the calibrated MR control sequence, and emit said control signals to said MR data acquisition scanner in order to operate the MR data acquisition scanner according to the calibrated MR control sequence in said MR scan of said object; and determine a spatial distribution of at least one of said first substance in said examination region and said second substance in said examination region, and determining at least one of said first reference value and said second reference value dependent on said spatial distribution.

10. A method for calibrating a magnetic resonance (MR) control sequence, comprising:
providing a calibration processor with an MR control sequence comprising a first radio-frequency (RF) pulse and a second RF pulse for operating an MR data acquisition scanner in order to execute an MR scan of an examination region of an object;
with said calibration processor:
determining a first reference value for the first RF pulse for resonant excitation of a first substance in said examination region;
determining a second reference value for the second RF pulse for resonant excitation of a second substance in said examination region;
determining at least one of said first reference value and said second reference value by operating said MR data acquisition scanner to execute a selective excitation of said first substance, or operating said MR data acquisition scanner with selective excitation of said second substance;
calibrating said original MR control sequence in order to produce a calibrated MR control sequence by assigning said first reference value to said first RF pulse, and assigning said second reference value to said second RF pulse; and
generating control signals corresponding to the calibrated MR control sequence, and emitting said control signals to said MR data acquisition scanner in order to operate the MR data acquisition scanner according to the calibrated MR control sequence in said MR scan of said object,
wherein at least one of said first reference value and said second reference value is a reference voltage.

11. The MR apparatus as claimed in claim 8, wherein the calibration processor is configured to determine a frequency spectrum of substances in said examination region, and to determine at least one of said first reference value and said second reference value dependent on said frequency spectrum.

12. The MR apparatus as claimed in claim 8, wherein the calibration processor is configured to determine a general reference value for the examination region, for all RF pulses in said original MR control sequence, and to determine at least one of said first reference value and said second reference value dependent on said general reference value.

13. The MR apparatus as claimed in claim 8, wherein the calibration processor is configured to determine a spatial distribution of at least one of said first substance in said examination region and said second substance in said examination region, and determining at least one of said first reference value and said second reference value dependent on said spatial distribution.

14. The MR apparatus as claimed in claim 8, wherein the calibration processor is configured to execute said MR scan with said calibrated MR sequence by using said first RF pulse for generating an MR signal, and using said second RF pulse for modulating a contrast of said MR signal.

15. The non-transitory, computer-readable data storage medium of claim 9, wherein the programming instructions cause the computer to:
determine a frequency spectrum of substances in said examination region, and to determine at least one of said first reference value and said second reference value dependent on said frequency spectrum.

16. The non-transitory, computer-readable data storage medium of claim 9, wherein the programming instructions cause the computer to determine a general reference value for the examination region, for all RF pulses in said original MR control sequence, and to determine at least one of said first reference value and said second reference value dependent on said general reference value.

17. The non-transitory, computer-readable data storage medium of claim 9, wherein the programming instructions cause the computer to execute said MR scan with said calibrated MR sequence by using said first RF pulse for generating an MR signal, and using said second RF pulse for modulating a contrast of said MR signal.

18. The non-transitory, computer-readable data storage medium of claim 9, wherein at least one of said first reference value and said second reference value is a reference frequency.

19. The non-transitory, computer-readable data storage medium of claim 9, wherein at least one of said first reference value and said second reference value is a reference voltage.

20. The method as claimed in claim 10, comprising:
in said calibration processor, determining a frequency spectrum of substances in said examination region; and
determining at least one of said first reference value and said second reference value dependent on said frequency spectrum.

21. The method as claimed in claim 10, comprising:
in said calibration processor, determining a general reference value for the examination region, for all RF pulses in said original MR control sequence; and
determining at least one of said first reference value and said second reference value dependent on said general reference value.

22. The method as claimed in claim 10, comprising:
executing said MR scan with said calibrated MR sequence by using said first RF pulse for generating an MR signal, and using said second RF pulse for modulating a contrast of said MR signal.

* * * * *